(12) United States Patent
Kim et al.

(10) Patent No.: US 11,462,266 B1
(45) Date of Patent: Oct. 4, 2022

(54) MITIGATING WRITE DISTURBANCE ERRORS OF PHASE-CHANGE MEMORY MODULE

(71) Applicants: SEOUL NATIONAL UNIVERSITY R&DB FOUNDATION, Seoul (KR); Foundation for Research and Business, Seoul National University of Science and Technology, Seoul (KR)

(72) Inventors: Hyun Kim, Seoul (KR); Hyo Keun Lee, Seoul (KR); Seung Yong Lee, Seoul (KR); Hyuk Jae Lee, Gyeonggi-do (KR)

(73) Assignees: SEOUL NATIONAL UNIVERSITY R&DB FOUNDATION, Seoul (KR); Foundation for Research and Business, Seoul National University of Science and Technology, Seoul (KR)

( * ) Notice: Subject to any disclaimer, the term of this patent is extended or adjusted under 35 U.S.C. 154(b) by 0 days.

(21) Appl. No.: 17/371,872

(22) Filed: Jul. 9, 2021

(30) Foreign Application Priority Data

Apr. 1, 2021 (KR) .......................... 10-2021-0042919

(51) Int. Cl.
*G11C 11/00* (2006.01)
*G11C 13/00* (2006.01)

(52) U.S. Cl.
CPC ........ *G11C 13/0004* (2013.01); *G11C 13/004* (2013.01); *G11C 13/0026* (2013.01); *G11C 13/0028* (2013.01); *G11C 13/0064* (2013.01); *G11C 13/0069* (2013.01); *G11C 2013/0047* (2013.01)

(58) Field of Classification Search
CPC ............ G11C 13/0004; G11C 13/0026; G11C 13/0028; G11C 13/004
USPC ........................................................ 365/148
See application file for complete search history.

(56) References Cited

U.S. PATENT DOCUMENTS

| 2008/0310211 | A1* | 12/2008 | Toda | .................. | G11C 13/0016 |
|---|---|---|---|---|---|
| | | | | | 365/148 |
| 2010/0210871 | A1* | 8/2010 | Kobler | .................. | C07C 303/22 |
| | | | | | 562/512 |

OTHER PUBLICATIONS

Hyokeun Lee et al, "Mitigating Write Disturbance Errors of Phase-Change Memory as In-Module Approach", arXiv:2011.00448v1 [cs.AR] Nov. 1, 2020.

* cited by examiner

*Primary Examiner* — Vu A Le
(74) *Attorney, Agent, or Firm* — Studebaker & Brackett PC

(57) ABSTRACT

Provided is a phase-change memory (PCM) module including a PCM device including a bit line and a word line, a memory controller configured to output a command related to an operation of the PCM device, and an interference mitigation part located between the memory controller and the PCM device and configured to perform a rewrite operation on the basis of a state transition characteristic of the command output from the memory controller.

10 Claims, 16 Drawing Sheets

FIG. 12

| Simulator | Device | Description |
|---|---|---|
| gem5 | Cores | Out-of-order, 4-core, 2GHz |
| | L1 cache | I-cache: 2-way set associative, D-cache: 4-way set associative, each has a capacity of 64KB. |
| | L2 cache | Shared last-level cache. 16-way set associative, 1MB. |
| NVMain | Media controller | Separated write queue and read queue (64-entry), FR-FCFS. |
| | PCM | Differential write supported<br>Read: 100ns<br>RESET: 100ns, SET: 150ns<br>Write disturbance limitation: 1K<br>Size: 8GB (2-rank, 2-bank/rank) |

FIG. 13

| Workloads | Description | MPKI |
|---|---|---|
| SPEC::bzip2 | General compression | 11.98 |
| SPEC::sjeng | Artificial intelligence (chess) | 0.89 |
| SPEC::h264ref | Video compression | 1.65 |
| SPEC::gromacs | Biochemistry | 5.49 |
| SPEC::gobmk | Artificial intelligence (go) | 6.65 |
| SPEC::namd | Biology | 1.09 |
| SPEC::omnetpp | Discrete event simulation program | 6.99 |
| SPEC::soplex | Linear programming optimization | 21.31 |
| pmix1 | Queue, Hashmap, B-tree, Skiplist | 10.24 |
| pmix2 | Queue, B-tree, RB-tree, Skiplist | 11.10 |
| pmix3 | Hashmap, RB-tree, Queue, Skiplist | 8.95 |
| pmix4 | RB-tree, Hashmap, B-tree, Skiplist | 10.12 |

MITIGATING WRITE DISTURBANCE ERRORS OF PHASE-CHANGE MEMORY MODULE

CROSS-REFERENCE TO RELATED APPLICATION

This application claims priority to and the benefit of Korean Patent Application No. 10-2021-0042919, filed on Apr. 1, 2021, the disclosure of which is incorporated herein by reference in its entirety.

BACKGROUND

1. Field of the Invention

The present invention relates to a phase-change memory (PCM) module.

2. Discussion of Related Art

Due to the expansion of server system technology for supporting high performance computing and an increase in demand for storage capacity, phase-change memories (PCMs) are attracting attention as next-generation non-volatile memories (NVMs) which satisfy the requirements.

However, a write disturbance error (WDE) is a serious problem of reliability which hinders commercialization of PCMs. The WDE occurs at neighboring cells of a written cell due to heat emission.

Existing research for preventing a WDE is based on a write cache or verify-and-correction but is inappropriate for high performance computing due to significant area overhead and performance degradation. Accordingly, an on-demand correction is necessary to minimize performance overhead.

PCMs are attracting attention as NVMs for replacing existing dynamic random access memory (DRAM)-based main memory systems or introducing a new storage-class memory layer between a DRAM and a storage. Recently, software-defined memories have been proposed to use NVMs as high-speed storages or expanded main memories interchangeably on user-level applications.

On the other hand, applications of in-memory database require data to be retained with a lower latency time in persistent memories. PCMs are proposed as a suitable candidate for solving this problem.

Also, PCM-based products are tested in various environments for performance evaluation and exploration of suitable applications thereof. Accordingly, utilizing and enhancing the PCM-related technology is important in achieving a low-latency and large-scale memory system in the future.

Even though PCMs have attractive characteristics, it is not fully commercialized due to lower cell reliability than DRAMs. In particular, there are several kinds of reliability issues in PCMs, such as cell endurance, resistance drift, and read/write disturbance.

WDEs are one of the major problems which delay the massive commercialization of PCMs. WDEs are defined as an interference problem on adjacent cells similar to row-hammer in DRAM devices. However, unlike DRAM row-hammer, a WDE specially occurs on an idle cell near a cell under RESET and is the problem of changing the state of an idle cell and reading an incorrect value.

In addition, a widely-used application, such as in-memory database, directly stores data in NVMs which heavily utilize cache-line flush commands. This kind of application may incur frequent write operations on PCMs and thereby makes cells vulnerable to WDEs. Existing techniques for mitigating WDEs, such as Data encoding based INsulation technique (DIN), Lazy correction, and Architecture for write DisturbAnce Mitigation (ADAM), are built on the top of verify-and-correction (VnC), which significantly degrades performance and consequently hinders the implementation of a high performance computing platform.

Meanwhile, a solution for WDEs, the write cache-based method, rarely considers the size limit of a supercapacitor which is required for data flush on a system crash or failure (hold-up time up to 100 µs for commercial devices).

To avoid these disadvantages (i.e., performance degradation and additional hardware resource), the present invention proposes a low-cost in-module disturbance barrier (IMDB).

Related arts are built upon the probability-based WDE trigger model which incurs WDEs for specific probabilities. However, it has been recently reported that the WDE occurs when the cells are exposed to a RESET operation for a specific time. Unlike the related arts, according to the present invention, the number of 1-to-0 bit flips (i.e., the number of RESETs) is recorded. Accordingly, most of the WDE-vulnerable data may be rewritten right before 1-to-0 bit flips reach the disturbance limitation.

Most data is recorded not only in a static random access memory (SRAM)-based table to manage more write addresses but also in a smaller supercapacitor area required for a system failure, except for a higher-tier second table named barrier buffer, to minimize additional hardware resources. Meanwhile, if the replacement policy merely considers an entry holding a smaller number of 1-to-0 flips as an eviction candidate, temporal locality would be overlooked.

SUMMARY OF THE INVENTION

The present invention is directed to providing a phase-change memory (PCM) module for reducing write disturbance errors (WDEs).

Specifically, the present invention is directed to solving WDEs of a phase-change random access memory (PRAM) by estimating addresses vulnerable to interference from a WDE limitation number and restoring a state of data allocated to the addresses unlike a related art of encoding a data pattern or determining whether an error occurs in every read operation.

According to an aspect of the present invention, there is provided a PCM module including a PCM device including a bit line and a word line, a memory controller configured to output a command related to an operation of the PCM device, and an interference mitigation part located between the memory controller and the PCM device and configured to perform a rewrite operation on the basis of a state transition characteristic of the command output from the memory controller.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 12 is a table showing simulation configurations;

FIG. 13 is a table showing workload information;

DETAILED DESCRIPTION OF EXEMPLARY EMBODIMENTS

Figure 1:
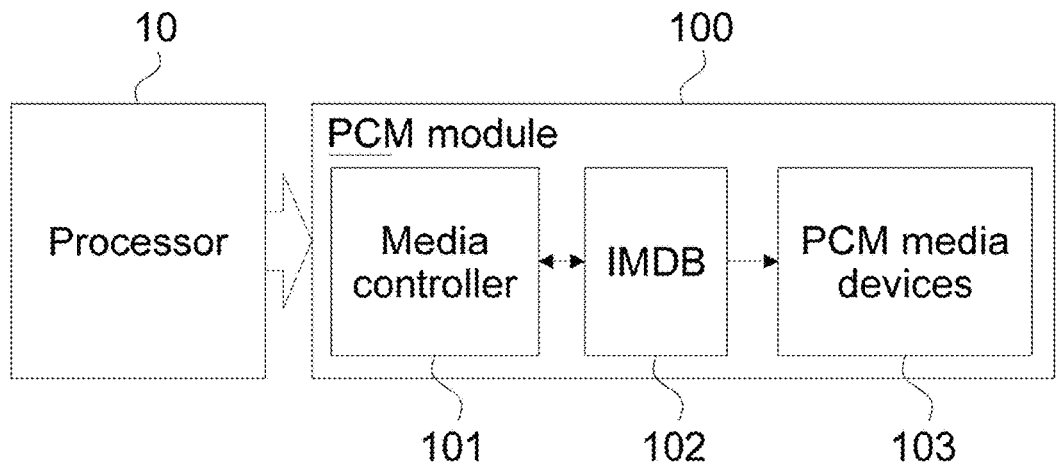
FIG. 1 is a block diagram showing elements of a phase-change memory (PCM) module according to an exemplary embodiment of the present invention.

Hereinafter, exemplary embodiments of the present invention will be described in detail with reference to the accompanying drawings so that those of ordinary skill in the art may easily implement the embodiments. However, the present invention can be embodied in various different forms and is not limited to the drawings and embodiments disclosed below. To clearly describe the present invention, parts unrelated to the present invention are omitted. Throughout the drawings, like reference numerals refer to like elements.

First, the concept of a phase-change memory (PCM) will be described below.

Figure 3:
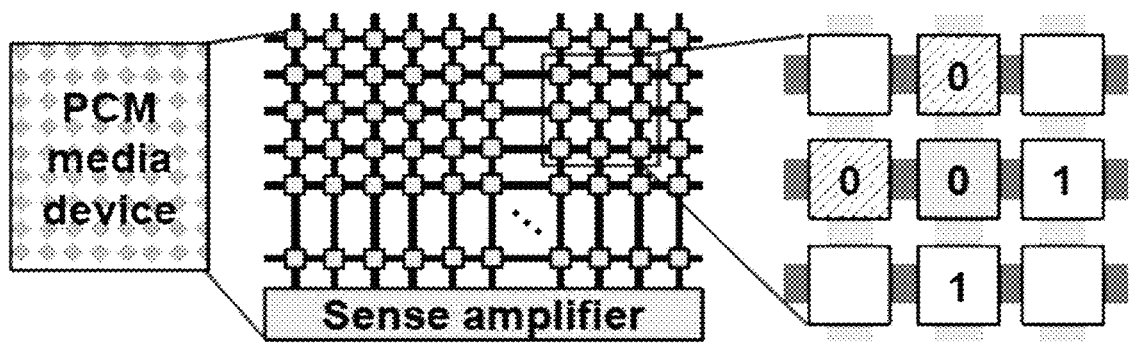
FIG. 3 is a conceptual diagram illustrating a write disturbance error (WDE) in a cell array.

Referring to FIG. 3, the PCM is a resistive memory device formed of a $Ge_2Sb_2Te_5$ (GST) material which utilizes two material states, that is, amorphous and crystalline, to program cells with heat. The amorphous state is achieved by heating the bottom electrode of the device to 600° C. for a short time, and the cell resistance is increased (i.e., RESET) accordingly. On the other hand, the crystalline state is achieved by supplying heat at 300° C. for a longer time compared to the amorphous state. Data stored in the PCM may be simultaneously sensed by supplying a sensing voltage to the cells. Therefore, the read latency time is much shorter than the write latency time.

FIG. 1 is a block diagram showing elements of a PCM module according to an exemplary embodiment of the present invention.

As shown in FIG. 1, a PCM module 100 may include PCM devices 103 including bit lines and word lines, a memory controller 101 which outputs a command related to an operation of the PCM devices 103, and an interference mitigation part 102 which is located between the memory controller 101 and the PCM devices 103 and performs a rewrite operation on the basis of a state transition characteristic of the command output from the memory controller 101.

Figure 2:
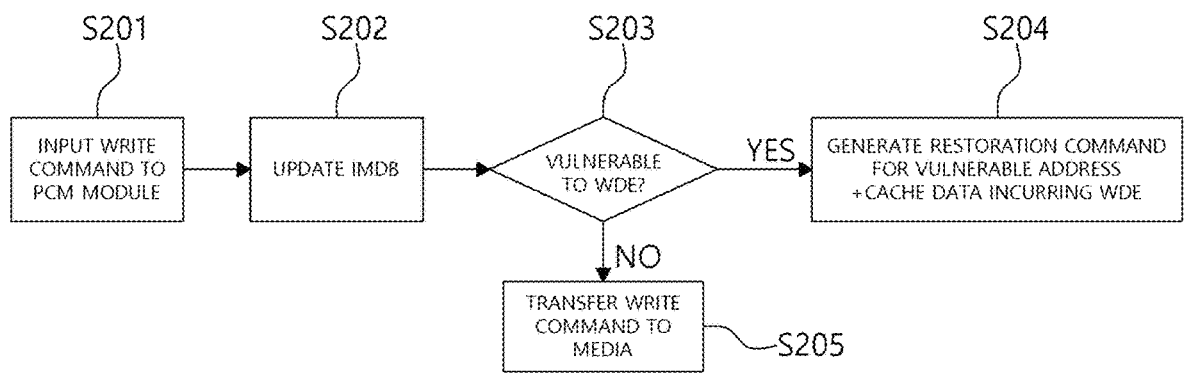
FIG. 2 is a flowchart illustrating a method of controlling a PCM module according to the present invention.

FIG. 2 is an operational diagram of a PCM module.

Referring to FIG. 2, the interference mitigation part 102 may calculate the number of 1-to-0 flips of a command output from the memory controller 101 and perform a rewrite operation for the command when the calculated number of flips exceeds a preset threshold value.

For reference, the interference mitigation part 102 may be defined as an in-module disturbance barrier (IMDB).

Specifically, the interference mitigation part 102 may include at least one of a main table for storing the accumulated number of rewrite operations and the accumulated number of calculated flips, a buffer table for storing data related to a command to be rewritten, and an Approximate Lowest number Estimator (AppLE) for sampling one group from a plurality of table entries to minimize a cycle consumed by a replacement policy of the main table and the buffer table.

Specifically, the data structure of each entry included in the main table may include at least one of an address variable (Row & Col) which represents an address corresponding to a command, a rewrite control variable (RewriteCntr) which is increased by a preset value every time a rewrite operation is performed by the interference mitigation part 102, a zero flip control variable (ZeroFlipCntr) which represents the accumulated number of 1-to-0 flips, and a max zero flip control variable (MaxZFCidx) which represents an index corresponding to the largest one of zero flip control variables.

In an exemplary embodiment, when the zero flip control variable of one entry exceeds the preset threshold value, the interference mitigation part 102 may perform a rewrite operation for the entry.

Meanwhile, when a rewrite operation is performed for one command, the interference mitigation part 102 may record data corresponding to the command in the main table to the buffer table.

Here, the data structure of an entry included in the buffer table may include at least one of an address variable in which the address variable in the main table is transferred and stored, a rewrite control variable in which the rewrite control variable in the main table is transferred and stored, a command variable which stores the command, and a frequency control variable (FreqCntr).

Also, the AppLE may define a certain number of main table entries as one group and perform a replacement policy for the main table by applying the defined group as one unit cycle.

In other words, the AppLE may set a random offset for each of the defined groups and perform a read operation on entries included in the defined group on the basis of the set offset.

Meanwhile, the main table and the buffer table may include two sets of static random access memories (SRAMs).

For example, the main table may include a first SRAM and a second SRAM.

Here, the first SRAM may index an entry of the main table and may be allocated to an address variable in the main table, and the second SRAM may be allocated to a zero flip control variable, a max zero flip control variable, and a rewrite control variable in the main table.

Figure 4A:
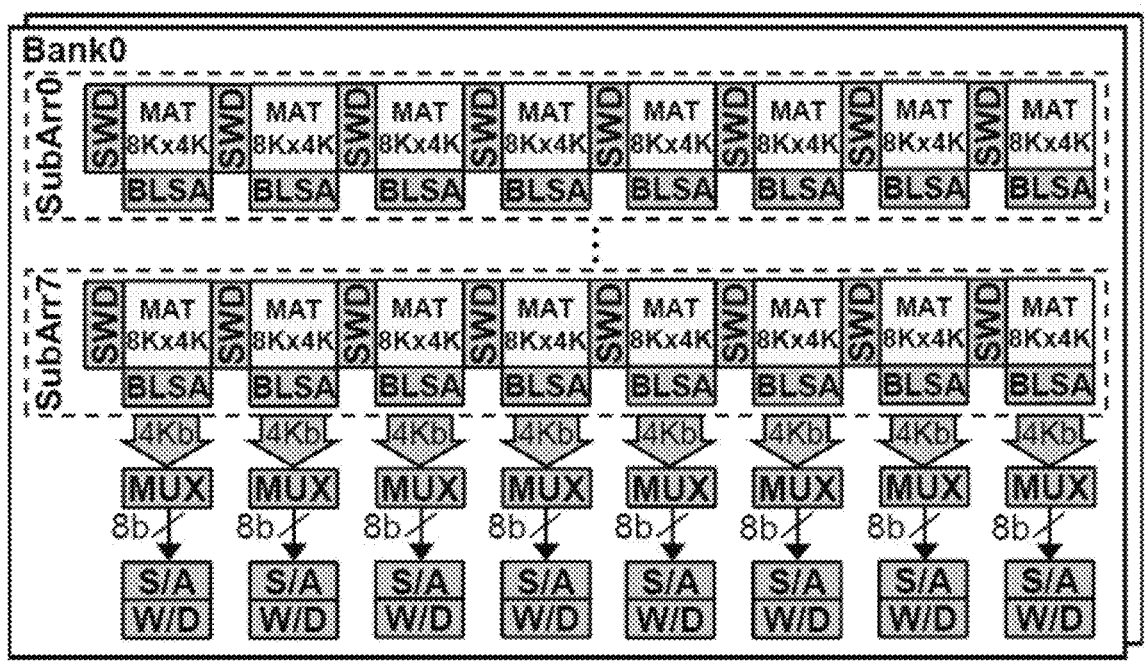
FIGS. 4A and 4B are conceptual diagrams illustrating an architecture of a PCM system according to the present invention.

A detailed overview of the PCM device of an 8 gigabyte (GB) module is illustrated in FIG. 4A.

The device includes eight subarrays, and each subarray includes eight mats (8K word lines and 4K bit lines for each mat). First, main word line drivers activate a subarray in each bank, and a row address is commonly fed into sub-word line drivers (SWDs) in the activated subarray to select a row which carries 4 KB data. Subsequently, the selected 4 KB data is sensed by bit line sense amplifiers (BLSA) and transferred through global bit lines (shaded arrow in FIG. 4A). Each column multiplexer (MUX) obtains 4 KB data from global bit lines and outputs 8 bit data to global sense amplifiers (S/As) with column address.

Figure 4B:
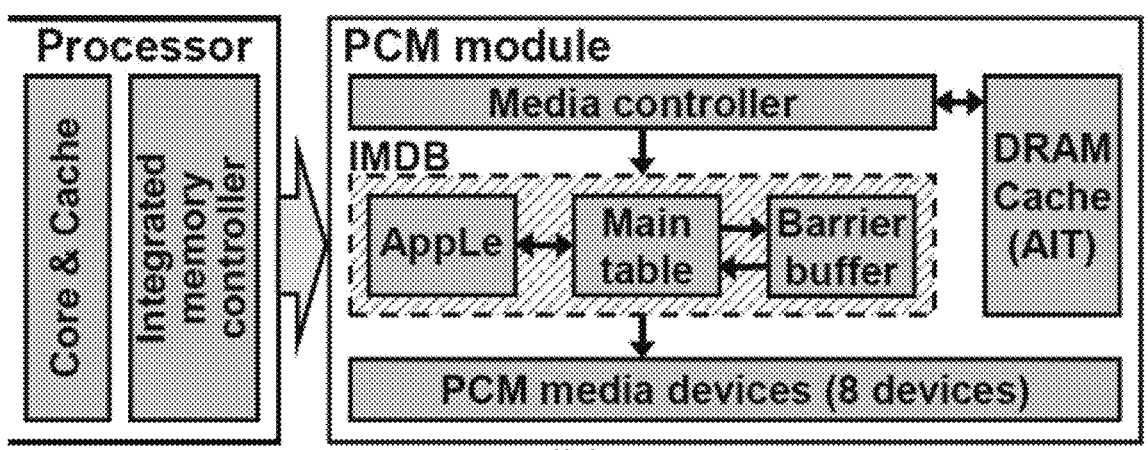

The output procedure implies that eight consecutive bit lines constitute one column. Finally, when eight data pins per device are assumed as shown in FIG. 4B, 8 word data is transferred to the data bus in burst mode, and a total of 64 B are carried out because eight devices are driven symmetrically by a single command as shown in FIG. 4B.

For a write operation, data on write drivers (W/D) are written back to the cell array with differential write. Herein, it is assumed that the columns are well insulated from each other. Accordingly, the neighboring columns do not incur write disturbance errors (WDEs). Otherwise, four or more read operations are required for each write operation when verify-and-correction (VnC) is adopted, and thus the overhead of baseline design is reduced as well. In addition, since the material of the PCM is configured to overlap a bit line, WDEs mainly occur on adjacent materials which are patterned on the same bit line.

Modeling of write disturbance in the PCM will be described below.

WDEs hinder the popularization of a device which shifts the resistance of a cell in the amorphous state to the crystalline state. As shown in FIG. 3, a WDE occurs on an idle cell adjacent to a cell under a RESET operation. The heat emitted during a SET operation is nearly half of that during a RESET operation. Accordingly, the temperature of an idle cell next to the programmed cell is higher than the temperature of cells under SET but lower than that of cells under RESET. As a consequence, a phase transition may occur on that idle cell. In a word, WDEs are highly likely to occur on idle cells having high resistance, and the neighbors are programmed as zero. Noticing when a WDE occurs is also important for modeling a WDE in a simulator. Unlike a probabilistic model which incurs a WDE for a specific probability, an earlier study has recently reported that a WDE is incurred by the accumulation of a number of write operations. Specifically, a WDE occurs when a cell is continuously exposed to a relatively high temperature. Therefore, when cells around an idle cell are in a RESET state for a certain number of times, the idle cell has a high chance of disturbance.

In the present invention, for convenience of description, it is assumed that a disturbance limitation number is 1K (i.e., a WDE occurs when a cell is exposed to a 1K number of 1-to-0 flips on neighbors).

For reference, various studies aimed at reducing WDEs in the PCM are under way.

First, VnC is the most naïve and rigid method to reduce WDEs. Two pieces of neighbor data are read for verification before data writing. Subsequently, the data is read again after the data is written. When a WDE occurs, correction is performed. Although it is an effective WDE mitigation method, significant performance overhead is induced by four more read operations for each write operation (including correction).

According to a related art, lazy correction is built on the top of an error correction pointer (ECP) chip, and locations of disturbed cells are temporarily stored in the ECP. Accordingly, the correction may be deferred to be as late as possible until the ECP becomes full within a super-dense PCM module (SD PCM). However, lazy correction requires one additional device which has larger process technology than normal devices. Since VnC-based approaches incur considerable performance overhead, some methods have been proposed to reduce WDE vulnerable patterns by utilizing data encoding. Accordingly, less or no VnC is necessary.

A Data encoding based INsulation technique (DIN), which is another existing method, proposes a codebook which encodes continuous 0s in a compressed cache line as "01" or "10" patterns. Accordingly, the DIN may eliminate disturbance vulnerable patterns as much as possible. However, the encoded data needs to be in the range of the length of the cache line (i.e., 512 bits). Otherwise, the DIN falls back to the VnC method, and thus performance is significantly degraded.

MinWD, which is another existing method, encodes write data into three candidates with special shift operations and selects the most aggressive encoding form among candidates. However, the encoding methods generally require support of multi-bit error correction code, which is unaffordable in general client nodes, unlike a server side.

An architecture for write DisturbAnce Mitigation (ADAM), which is another existing method, compresses a cache line with the frequent pattern compression (FPC) and aligns the line to the right and left alternatively. Accordingly, adjacent cells holding valid data bits are reduced greatly. However, the compressed word is still vulnerable to WDEs when the length of the compressed word is longer than 50% of the original data length. Data caches are used to increase throughput of a system. However, data caches also can be utilized to reduce WDEs by temporarily storing frequently written data into the more reliable volatile region such as SRAM.

A sparse-insertion write cache (SIWC), which is another existing method, utilizes a write cache for absorbing bit flips to reduce WDEs. The SIWC utilizes a probabilistic method, coin tossing, to evict data from the write cache and insert new data with certain probabilities. Since most of the data in which a WDE may easily occur is stored in the write cache, victims of WDEs become secure. However, this method introduces several megabytes of volatile memory to obtain a higher hit ratio. Furthermore, even when the write cache is embedded in the memory module, a supercapacitor for data flush on a system failure needs to be expanded as the volatile region enlarges. Generally, a commercial non-volatile dual in-line memory module (NVDIMM) ensures that volatile data needs to be flushed within 100 µs. Accordingly, it is necessary to reduce the write cache size to a more practical value while sufficiently utilizing disturbance-vulnerable write patterns. Moreover, it is reported that WDEs likely occur when cells are exposed to RESET for specific times. Accordingly, using this information is important to markedly reduce WDEs.

An IMDB according to the present invention will be described below.

First, the overall system of an IMDB is as follows.

FIG. 4B shows the overall system layout in which NVM commands are sent from an integrated memory controller (iMC). For a DIMM-based PCM module, an on-DIMM media controller includes a read queue and a write queue. A scheduler is used to schedule commands and assign commands to appropriate banks in the media. A dynamic random access memory (DRAM) cache is used to store an address indirection table.

The IMDB module proposed by the present invention is present between the media controller and the PCM. The IMDB module includes the main table, a barrier buffer, and a finite state machine which controls entry migration between two tables. Data flip patterns of write commands in this module are managed to trigger rewriting WDE-vulnerable addresses before the occurrence of a WDE instead of being based on VnC. The introduction of IMDB induces variable latencies during the transaction. However, the iMC in the processor may communicate via a double data rate transactional (DDR-T) protocol and thus allows variable latencies as in commercial persistent memory products.

Figure 5:
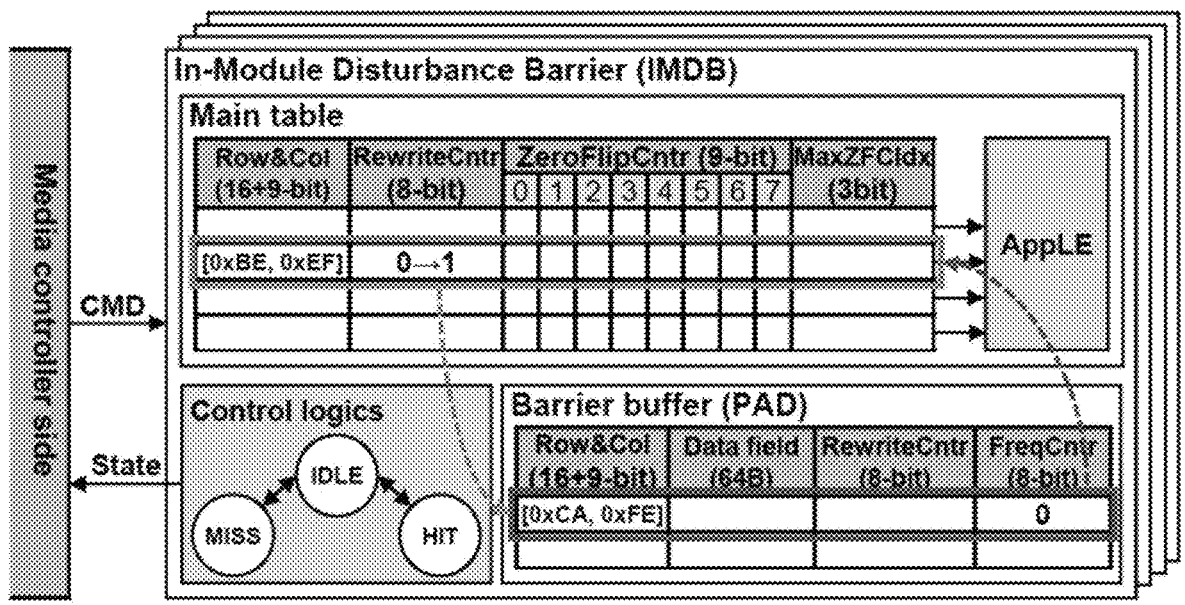
FIG. 5 is a conceptual diagram illustrating an architectural design of an in-module disturbance barrier (IMDB) according to the present invention.

FIG. 5 shows the architecture of an IMDB allocated for every bank. Accordingly, all IMDBs operate concurrently through all banks for a higher command processing throughput and implementation of simplicity. An IM4DB includes two tables which are a main table and a barrier buffer, and the functionality of each table will be described below.

First, the main table of the IMDB is implemented with a set of SRAMs. Accordingly, the IMDB may read or write only one entry at a time in which the content of the entry is updated through the control logic. Also, data is not stored in the main table to save power spent on supercapacitors. Specifically, four major fields are used to estimate the degree of WDE of a written address.

Row & Col: This contains row and column addresses in a bank which is currently managed in the main table.

ZeroFlipCntr: Eight sub-counters are in this field, each of which calculates the number of bit flips from 1 to 0 and manages each 64-bit data in a 64B cache line.

MaxZFCIdx: This indicates the maximum sub-counter of ZeroFlipCntr which is updated in the control logic after an entry is read. This is used to instantly compare the maximum value of ZeroFlipCntr with the threshold value for rewrite operations.

RewriteCntr: An eight-bit counter represents the frequency of rewrite operations on the address of Row & Col.

Since only one entry is accessible at a time, it is necessary to take resource contention on the IMDB into consideration. This problem is resolved by building a finite state machine having 3 states, that is, IDLE, HIT, and MISS, which represent the availability of the main table, in the control logic. A new command is not started by the IMDB when the state is not in IDLE. In other words, the main table is unavailable. After a command is inserted into one of the IMDBs from the media controller, the IMDB operates in two different ways regardless of whether an address is found in the table.

When an address is found in the main table, the state is shifted to HIT. Meanwhile, both newly and previously written pieces of data are passed to the control logic, and the number of 1-to-0 bit flips is updated by a dedicated 1-to-0 counter of the control logic. The number is accumulated in the corresponding ZeroFlipCntr. When the maximum value of ZeroFlipCntr surpasses the predefined threshold, two rewrites on adjacent word lines are generated and sent to the write queue in the media controller. Meanwhile, the value of RewriteCntr increases. Since system stability is important, the highest priority is given to the rewrite request.

When an address is not found in the main table, an insertion is required while the state is shifted to MISS. A probabilistic insertion method is used herein. According to the present invention, infrequent accesses are filtered out with a probability p to reduce evictions from the SRAM. When an insertion is required, a victim (will be described below) is determined according to the replacement policy defined herein, and thus a new entry can replace the victim entry.

In addition, it is necessary to determine two parameters, a threshold value of generating a rewrite command and an insertion probability p. First, the threshold value is determined according to a WDE limitation number. Since two word lines may disturb a word line, the threshold value is determined as a half of the WDE limitation number. Since the WDE limitation number of 1K is assumed herein, threshold value=511. Accordingly, the bit width of each ZeroFlipCntr becomes 9. With regard to the insertion probability p, a large value incurs frequency entry evictions, whereas a small value may skip a rewrite process even after a word line reaches the WDE limitation. According to the present invention, most of the malicious attacks may be detected for all benchmarks derived from various experiments, and thus p is assumed to be 1/128.

Next, the barrier buffer is described.

The barrier buffer which is a higher-tier table is utilized to store an address, and data frequently experiences 1-to-0 bit flips as shown in FIG. 5. The barrier buffer may directly provide a read request. For a master write command, when an address arrives at the barrier buffer, data is directly updated in the barrier buffer. Otherwise, a normal operation of the main table is performed when the address arrives at the main table as described above.

As shown in FIG. 5, an entry bounded by a green box is frequently exposed to 1-to-0 flips in the main table. As a result, the entry is invalidated and promoted to the barrier buffer when the value of RewriteCntr increases (i.e., rewrite occurs in the main table). The barrier buffer inherits the address and RewriteCntr information from the main table. When the barrier buffer is not full, the promoted entry may be directly disposed at an empty position in the barrier buffer. On the contrary, the promoted entry replaces the least frequently used (LFU) entry which is bounded by a blue box in the drawing. Accordingly, FreqCntr is required for the replacement policy as in a practical online detector (PAD).

On the other hand, the data of the LFU entry is sent back to the media controller so that the dirty data may be written back, and the information of the LFU entry is demoted to the entry of the main table at which the promoted entry has been present. As a result, the barrier buffer only stores frequently flipped data. Accordingly, WDEs can be further reduced. Since the barrier buffer may function concurrently with the main table, the latency time may be hidden.

In practice, both the main table and the barrier buffer in the IMDB are implemented as two sets of SRAMs. For the main table, two types of SRAMs are used. First, a dual-port content-addressable memory (CAM)-based SRAM is allocated as Row & Col fields to index entries in the table. On the other hand, a multi-port SRAM including ZeroFlipCntr, MaxZFCIdx, and RewriteCntr has one write port for updating content and multiple read ports for obtaining entry information at a time to apply the proposed replacement policy. Accordingly, the number of read ports is the same as the number of entries in the table. However, the next subsection shows that the number of read ports may be reduced by adopting the AppLE. For the barrier buffer, a dual-port CAM-based SRAM and a dual-port SRAM are assigned for Row & Col and data & RewriteCntr & FreqCntr, respectively. The burden of energy consumption is negligible because only a small number of entries in the barrier buffer are enough to provide high WDE mitigation performance as described below. It is to be noted that the valid bits are merely implemented as registers for directly probing status. The media controller is modified slightly to support the IMDB. First, previously written data needs to be collected in advance to calculate the number of bit flips. Accordingly, a prewrite read operation is required to get the previously written data. The controller has one or more data buffers to transfer the previous data, and an additional bit is required to distinguish prepared commands from unprepared commands (referred to as "prepared"). A prewrite read request is generated ahead of a write request. The prewrite read request has a higher priority than write requests but a lower priority than normal read requests. Since write requests in the media controller are drained when the write queue becomes full, a long idle time remains between the reading and writing data from/to the PCM media. In addition, a merge operation of write requests is introduced. In the merge operation, a rewrite operation is merged with existing write requests for the same address. Since a rewrite operation entirely writes all bits of data, excessive rewrites may continuously incur cascaded WDEs on neighbor lines. Therefore, when rewrite requests are integrated with existing requests in the queue, WDEs may be further reduced.

SIWC described as a related art requires 256×64 B=32 KB of SRAM for each PCM bank (when 256 addresses are managed).

On the other hand, in the method according to the present invention, the main table entry has 108 bits (=25 b+8 b+72 b+3 b), and the barrier buffer entry has 553 bytes (=64 B+25 b+8 b+8 b) (see FIG. 5).

Therefore, the proposed method requires 256×108b≈3.4 KB of SRAM for the main table per PCM bank, and the barrier buffer consumes 8×553 b≈0.6 KB of SRAM per PCM bank (see description below). Consequently, (3.4 KB+0.6 KB)×4 bank=16 KB of SRAM is converted into 2 KB per 1 GB of PCM.

Figure 6:
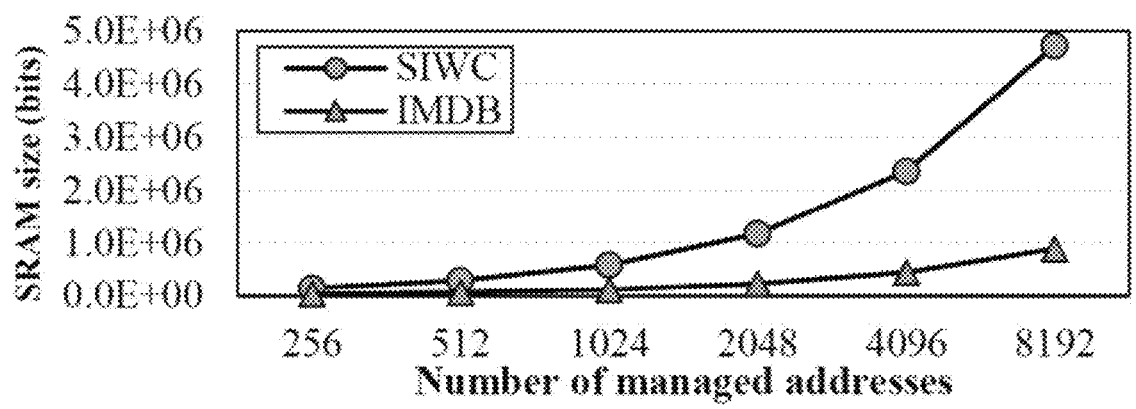
FIG. 6 is a graph illustrating a required capacity of static random access memory (SRAM) according to the number of addresses.

FIG. 6 shows the capacity of SRAM according to the number of managed addresses in an SRAM with regard to both the SIWC and the proposed method. When 256 addresses are managed in the SRAM, the proposed method consumes an SRAM area which is four times smaller than that of the SIWC. In addition, more energy needs to be stored in the supercapacitor to flush data during a system failure. The SIWC requires approximately 32 times more energy in the supercapacitor compared to the proposed method (i.e., 256 entries/8 entries=32). Since the relationship between an energy E and an area A of a capacitor is $E \propto A$, SIWC requires 32 times more area for supercapacitors. Since the write latency time of some PCMs is 150 ns, 256×150 ns/100 μs=38.4% or more of the constraint (i.e., 100us) is required as in the SIWC. Therefore, the proposed method is more practical than the related art.

A replacement policy will be described below.

A replacement (or eviction) policy for managing WDEs in a limited table according to disturbance-vulnerable is required. The least recently used (LRU) policy is a representative management policy which keeps tracks of the recency of access information in a constrained data structure. However, a WDE occurs when a cell is overly flipped. Accordingly, it is necessary to manage the frequency of 1-to-0 flips and select a replacement entry according to the corresponding information. In summary, a replacement policy which utilizes the knowledge of disturbance-vulnerable pattern in a limited table is necessary to evict vulnerable address information. A replacement policy is defined herein by utilizing ZeroFlipCntr and RewriteCntr. The former shows the degree of interference to adjacent word lines presently, and the latter declares the degree of interference to adjacent word lines historically as briefly described above. When the corresponding entry is not found and the input command demands a new entry in the main table which is fully occupied, the policy is ready to select a victim entry. The minimum number of ZeroFlipCntr is firstly extracted from the main table as a victim candidate because this is a less urgent aggressor presently. However, two or more victim candidates may exist due to the same value of ZeroFlipCntr. The aggressiveness of incurring WDEs may vary depending on RewriteCntr which is write information. Accordingly, an entry holding the minimum number of RewriteCntr is finally selected as a replacement entry.

The proposed replacement policy utilizes the knowledge of the disturbance-vulnerable patterns, that is, ZeroFlipCntr and RewriteCntr, well. However, the proposed policy ignores the "warm-up" phase of entries in the table. Since the policy prioritizes the present vulnerability (e.g., ZeroFlipCntr) to restore urgent data on demand, a recently inserted but insufficiently baked entry may be easily evicted from the main table. Although RewriteCntr contains the historical knowledge of WDEs, the knowledge is not useful when a corresponding entry is unluckily pushed out of the list by other addresses after being newly inserted.

Figure 7:
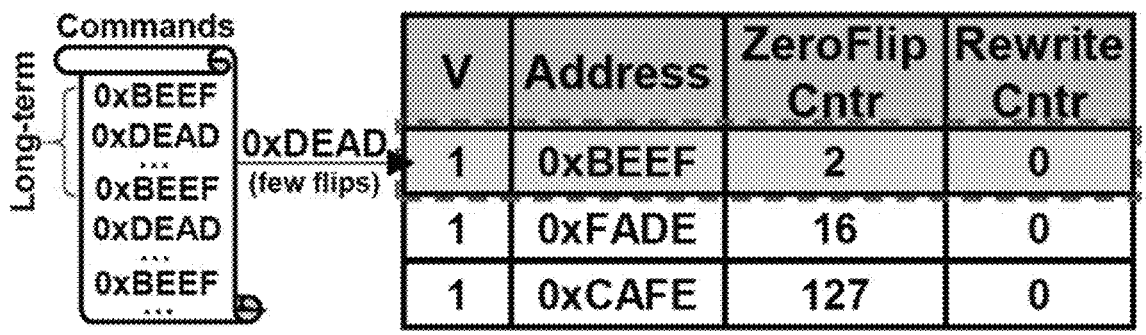
FIG. 7 is a conceptual diagram illustrating an example of a main table under a malicious attack.

As shown in FIG. 7, 0xBEEF and 0xFADE are recently inserted entries. In this example, 0xFADE luckily has a larger value of ZeroFlipCntr than 0xBEEF and the value does not vary dynamically in run time. Accordingly, a new input address 0xDEAD replaces 0xBEEF according to the policy. However, 0xBEEF tends to incur WDEs frequently with slow and gradual 1-to-0 bit flips, which may be seen as a kind of malicious attack. In a word, since the eviction predicate is no longer up-to-date as the LRU policy, a newly inserted entry may have a small value of ZeroFlipCntr. Accordingly, these entries are easily replaced by new addresses without being recognized as malicious access under the management of an IMDB. Therefore, on the top of the replacement policy, further knowledge is required to prevent attacks of such addresses. To solve this problem, prior knowledge is provided herein to prevent an entry from early eviction. The prior knowledge is defined as the number of zeros in each data block. Accordingly, a 0-counter is included in the control logic of the IMDB along with a 1-to-0 counter. When an address is newly inserted into the main table, the number of 1-to-0 flips is barely recorded, and the prior knowledge is recorded into ZeroFlipCntr as a bias value.

A lowest number estimator will be described below.

The eviction policy requires a multi-port SRAM and a set of comparators to obtain a victim entry among all entries. Here, the number of ports or read ports on the SRAM equals the number of entries. However, when the number of read ports increases, all of a latency time, an area, and energy increase (see FIG. 8). Assuming 256 entries in the main table, the comparators are modeled as 255 tree-structured dual-input comparators to minimize the latency time (i.e., 8 cycles). Therefore, 256 read ports are required on the SRAM. Although the multi-port SRAM has been adopted in the previous study for another purpose, it is infeasible in the practical design with regard to all of a latency time, an area, and energy when there are hundreds of read ports and a table has hundreds of entries.

Figure 8A:
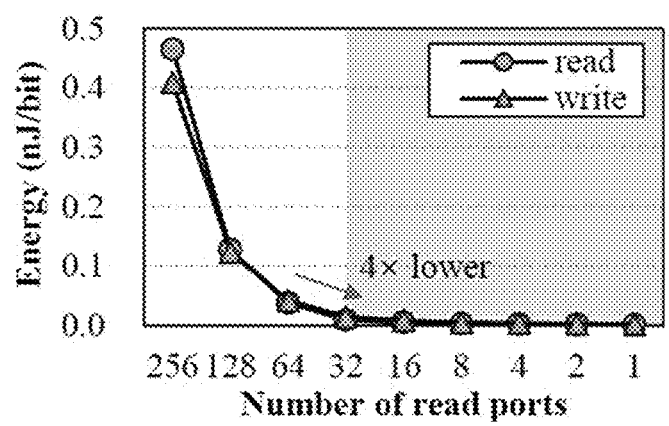
FIGS. 8A and 8B are a set of graphs showing energy, a latency time, and an area of a 256-entry SRAM having multiple read ports, which are extracted from CACTI.
Figure 8B:
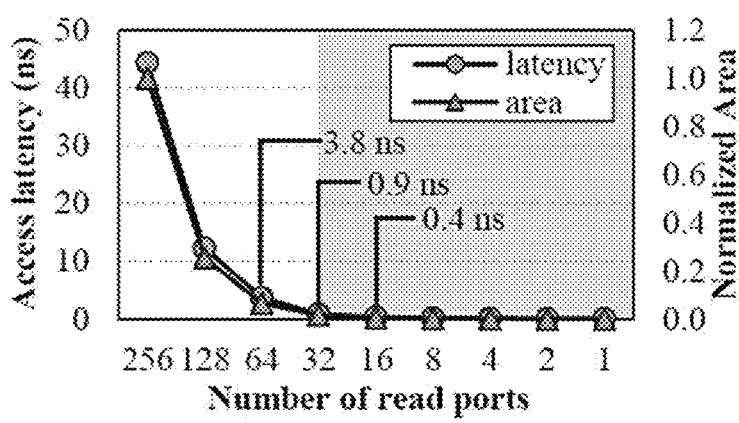
Figure 9:
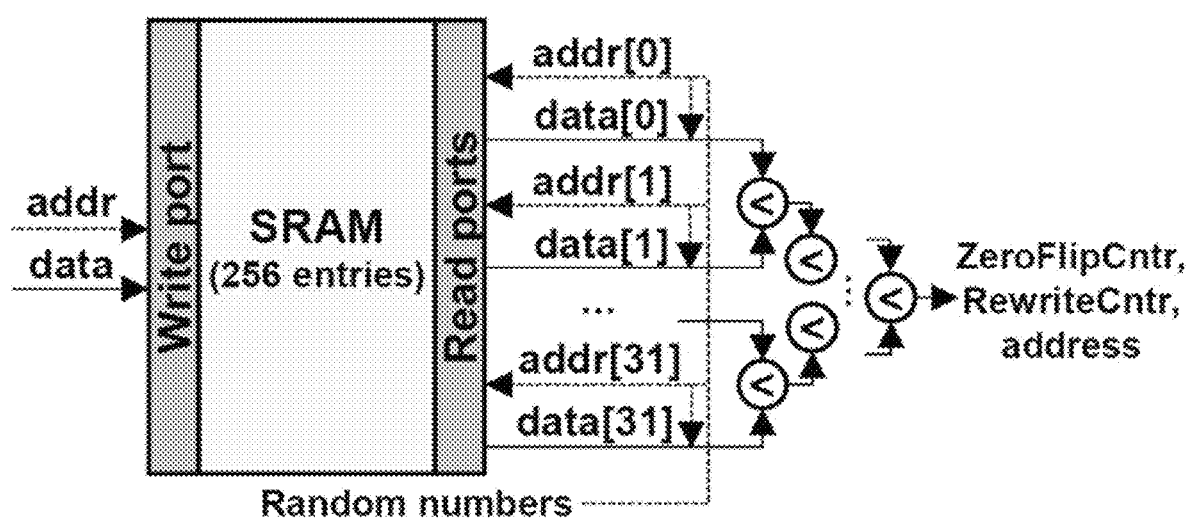
FIG. 9 is a conceptual diagram illustrating an Approximate Lowest number Estimator (AppLE) with 32 read ports.
Figure 10A:
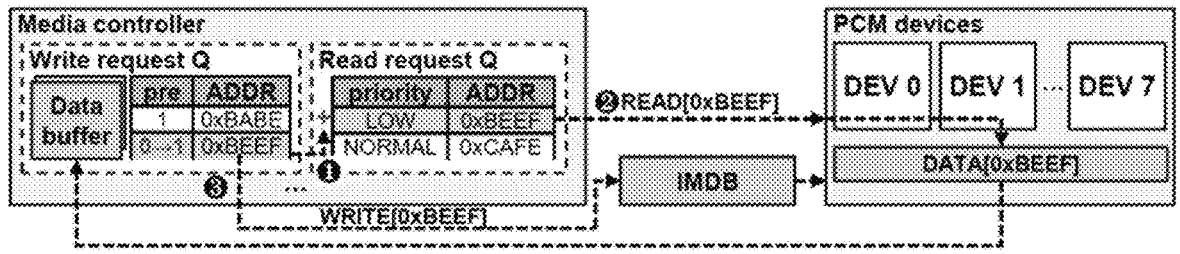
FIGS. 10A-10D are conceptual diagrams illustrating operations of an IMDB.
Figure 10B:
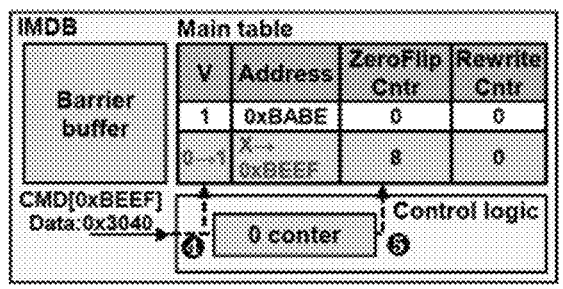
Figure 10C:
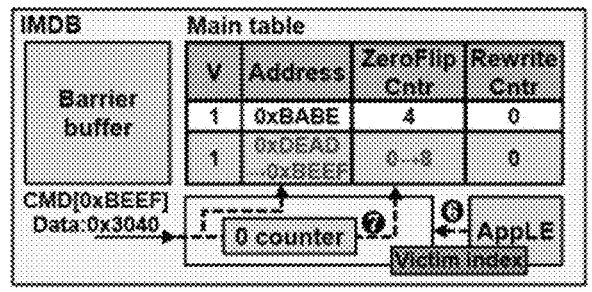
Figure 10D:
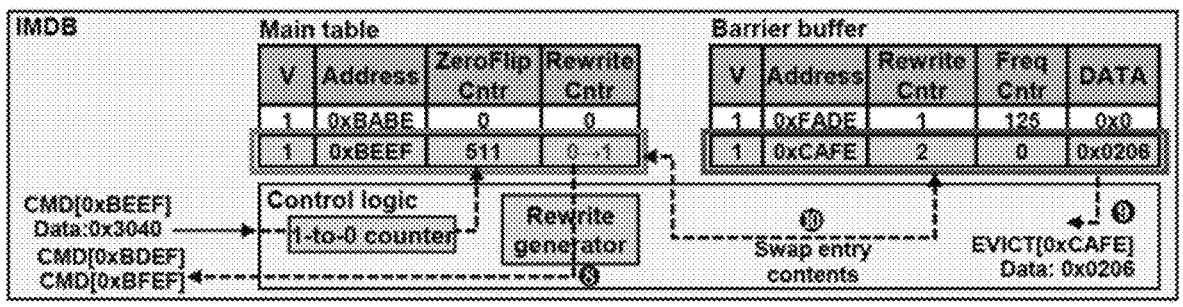

FIG. 8A shows energy consumption with regard to the number of read ports on an SRAM. The energy consumption drastically decreases when there are 32 read ports. Also, FIG. 8B shows that the latency time of an SRAM is below 1 ns, and the area drastically shrinks when there are 32 ports. Since the general input/output (I/O) clock frequency of DDR4 is higher than 800 MHz, the maximum target number of read ports herein is set to 32. A comparator structure with the AppLE is introduced herein. To reduce the number of read ports, as shown in FIG. 9, 32 groups are generated by binding a few entries (e.g., eight entries) as a group. In other words, 32 read ports are required rather than expanding the high-cost 256 read ports by adopting the AppLE. A number ranging from 0 to 7 is randomly generated from each group and fed to each address signal of the read port. Here, the value of port-indexx32 is added to each random number as an offset. Consequently, a comparator module with a 5-cycle latency time and 31 dual-input sub-comparators may be obtained. This methodology may be regarded as a randomized method in which WDE mitigation performance is determined by a group size.

All of the modules described above are bound as a single module below, and a toy example is described. The example assumes that row and column addresses are as follows.

In this example, a target address which incurs a WDE on neighbors is assumed to be eight bits as 0xBEEF. Here, the row address and the column address are 0xBE and 0xEF, respectively. Two bytes of data are transferred by a write command, and a single ZeroFlipCntr manages all data. Each of the main table and the barrier buffer includes four entries. Data preparation. The media controller receives a write command from the processor iMC and read data already stored in the PCM device to prepare to calculate 1-to-0 flips in the IMDB (1). Once previous data arrives through the read phase of the media controller (2), the command is issued to the IMDB along with new and previous data (3). Filling the main table. When the command in the previous operation arrives, the control logic decomposes the command address into row and column addresses to determine whether the command is a hit or amiss on the tables. In this case, misses occur both on the barrier buffer and the main table. However, the main table has a vacant space for the input command. In other words, the command information may be directly stored in the table by simply validating an entry instead of replacing the entry (4). As described above, the number of zeros in the write data is recorded in ZeroFlipCntr to prevent early eviction from the table without a "warm-up" period. When subsequent commands access the same address, 1-to-0 flip counts are calculated and added to the current ZeroFlipCntr (5). Replacement on the main table. When the main table is full and there is no entry available for the next input command, it is necessary to select a victim candidate and make room for the input command 0xBEEF. As shown in the drawing, the entry storing the information of 0xDEAD has the smallest number of ZeroFlipCntr among all entries calculated from the AppLE (6). Accordingly, all information of 0xDEAD is replaced by 0xBEEF concurrently (7). When repetitive writing to 0XBEEF with a frequent number of 1-to-0 flips causes ZeroFlipCntr to reach the threshold value, rewrite commands on neighboring lines (i.e., 0xBDEF and 0xBFEF) are generated and sent back to the media controller (8). Meanwhile, the barrier buffer selects a victim entry and demotes the victim entry to the main table. Also, an eviction command is generated on the basis of the victim entry and sent back to the media controller (9). After both the demoted entry and an entry incurring the rewrite operation (i.e., entry promotion) are read out from the table, the entries are interchangeably stored in the main table and the barrier buffer. Specifically, the promoted entry is stored with the write data to prevent a WDE (10).

As shown in FIG. 12, the PCM system is built upon NVMain which is an NVM simulator. The read latency time is set to 100 ns, and the write latencies of SET and RESET are respectively set to 150 ns and 100 ns with differential write support. A baseline herein does not adopt any WDE mitigation method. The energies per access to PCMs and CAM-based SRAMs are obtained from NVSim and CACTI, respectively. Both the SRAMs are configured with 22 nm technology. It is to be noted that the CAM-based SRAM is configured as a fully associated cache.

FIG. 13 shows workloads and associated misses per thousand instructions (MPKI) on the last-level cache. Normal workloads from SPEC CPU 2006 with both high and low MPKI are evaluated. Also, persistent data structures performing random insertions and deletions throughout 128 copies are implemented. These data structures are synthesized herein to generate four persistent workloads (prefixed as "pmix") and simulate realistic in-memory database workloads. This is because persistent workloads are generally executed in an NVM-based main memory system. Trace-based simulation is performed to reduce the simulation time. Trace files of the discussed workloads are extracted from the processor simulator gem5 as shown in FIG. 12. The proposed method is compared with three representative technologies, lazy correction, ADAM, and SIWC. SIWC-size indicates that the number of SRAM bytes for SIWC is identical to that of the proposed method, and SIWC-entry holds entries in an amount equal to that of the proposed method. Finally, lazy correction indicates that ten errors are hold in ECP devices.

Design parameters, specifically the number of entries $N_{mt}$ in the main table, the number of entries in the barrier buffer $N_b$, and the number of read ports $N_g$ (e.g., group size) dedicated to the AppLE, are important in the following case: realizing a cost-effective architecture for the proposed method. The trade-off function of the proposed method may be defined using Equation 1 below. Here, W, A, and S denote the number of WDEs, the area, and the speedup, respectively.

[Equation 1]

$$T = W(N_{mt}, N_b, N_g) + A(N_{mt}, N_b, N_g) + S^{-1}(N_b, N_g)$$

As described above, the area consumed by an SRAM may shrink noticeably from $N_g=32$ (see FIG. 8) and may also make the measurement negligible when $N_g<32$, as compared to a PCM. Also, 32 is defined as the maximum number of entries in the barrier buffer to ensure that the flush time (i.e., 100 μs) is not consumed when the proposed method is used. As a result, Equation 1 may be simplified as Equation 2 below.

[Equation 2]

$$T = W(N_{mt}, N_b, N_g) + A(N_{mt}, N_b) + S^{-1}(N_b, N_g), \text{ where } N_g \leq 32, N_b \leq 64$$

According to Equation 2, the effectiveness of the prior knowledge is evaluated, and the appropriate size $N_{mt}$ of the main table is determined. Subsequently, sensitivity analyses are performed on the number of entries in the barrier buffer $N_b$ and the group size for the AppLE $N_g$ to determine the cost-effective parameters. Finally, these parameters are applied and compared with those in previous studies to show the performance of the proposed method.

Figure 11A:
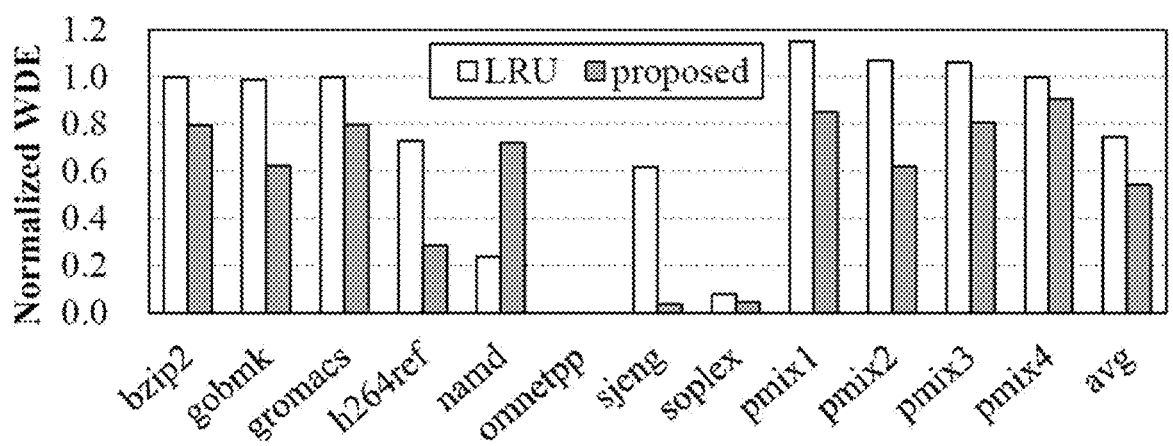
FIGS. 11A and 11B are a set of graphs showing performance according to different replacement policies.
Figure 11B:
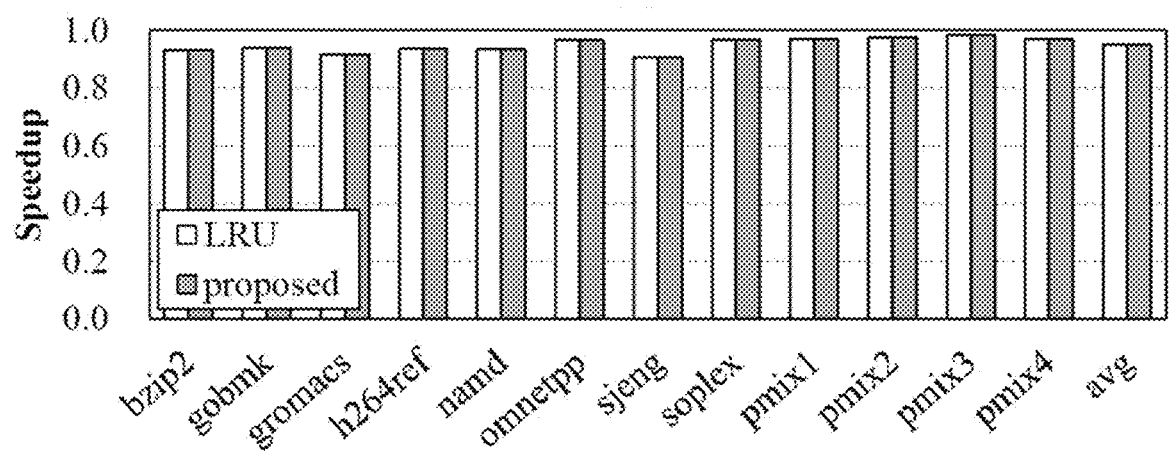

FIG. 11 shows WDEs with different replacement policies when there are 16 entries in the main table. As shown in FIG. 11A, the LRU scheme is applied to the policy in the main table such that a normalized WDE value of 0.74 is generated on average. In contrast, the proposed policy shows a normalized WDE of 0.54, indicating a 27% more stable system compared to the traditional replacement policy. Although the LRU policy yields fewer WDEs in applications with extremely high rates of locality (e.g., namd), most general applications yield far fewer WDEs. FIG. 11B shows speedup, which is defined as the execution time of the baseline over the execution time of the objective method. Both of the methods provide similar performance outcomes, in which the proposed method shows 0.002% lower performance than the LRU policy. From this perspective, the proposed replacement policy efficiently rewrites data vulnerable to WDEs and thus yields far fewer WDEs without compromising high performance computing.

Figure 14A:
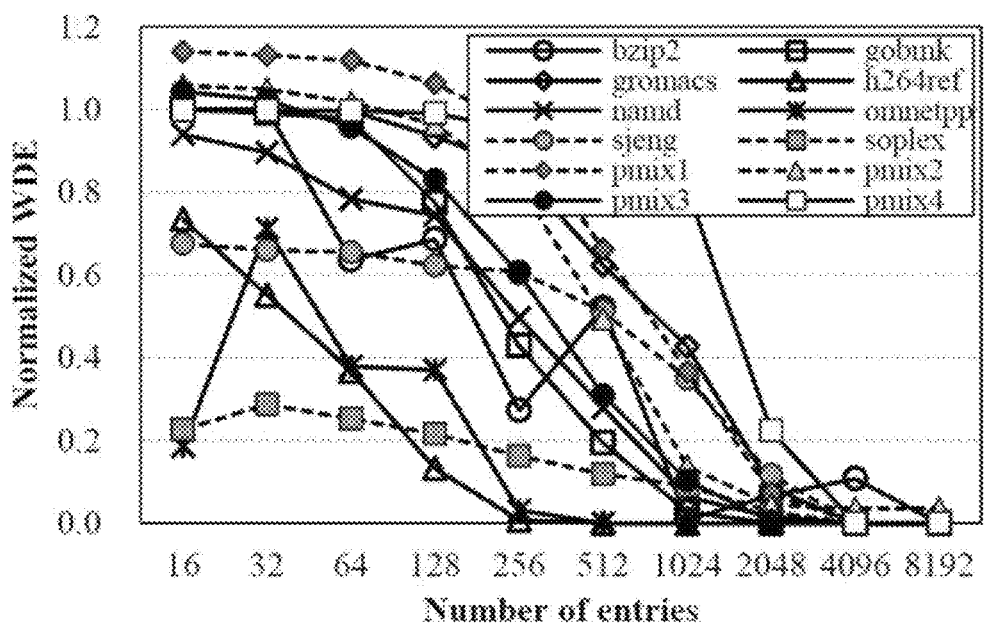
FIGS. 14A and 14B are a set of graphs illustrating WDEs normalized with regard to different numbers of entries in a main table.
Figure 14B:
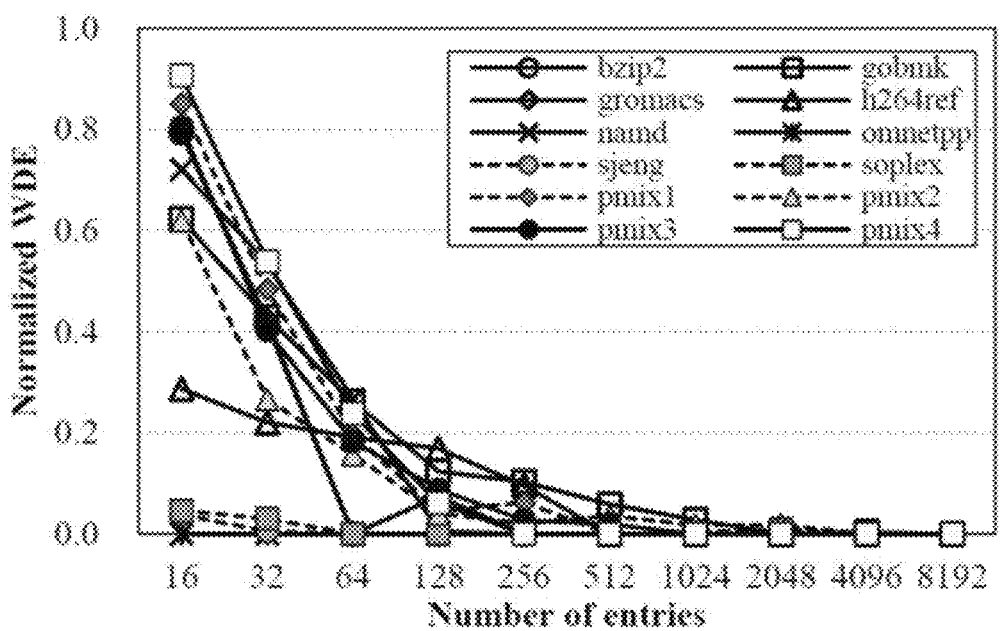
Figure 15:
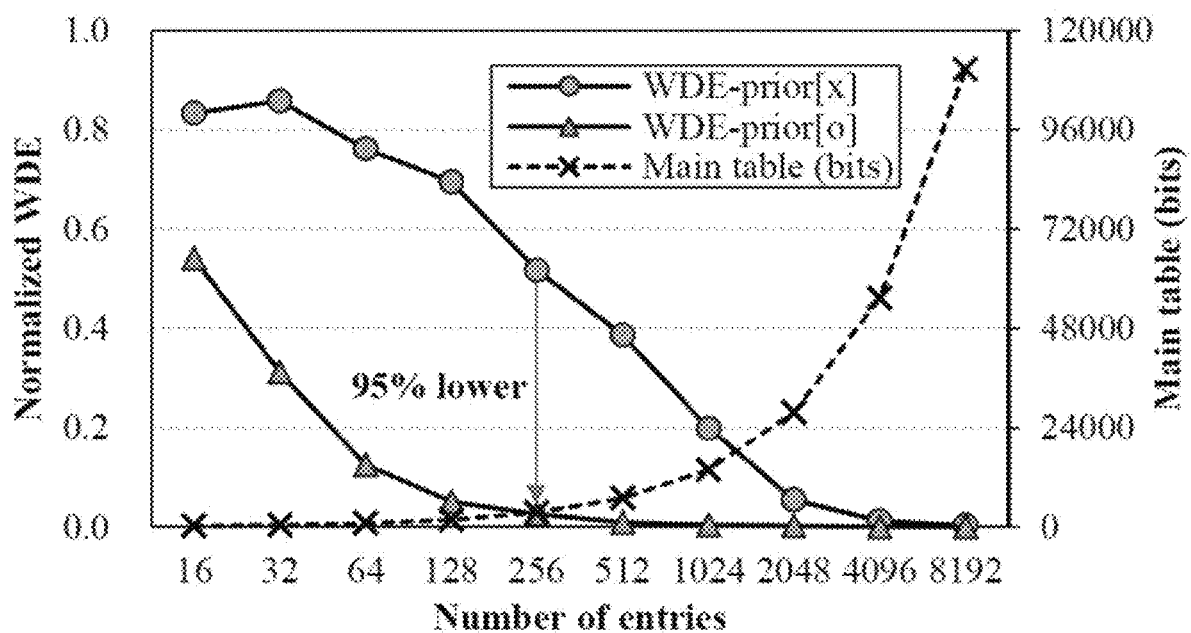
FIG. 15 is a graph illustrating an average-normalized WDE and SRAM capacity according to the number of entries in a main table.

FIG. 14 shows a normalized WDE according to the number of entries in the main table. As shown in the two figures, WDEs decrease as the number of entries increases. When a relatively small table is adopted, the number of WDEs exceeds that in the baseline due to the frequent evictions of newly inserted entries in the overall table. Also, WDEs decrease sharply from 2048 entries without prior knowledge as shown in FIG. 14A. On the other hand, the prior knowledge method with 256 entries provides a result equivalent to the method without prior knowledge and with 2048 entries as shown in FIG. 14B. In other words, the proposed method yields an eightfold increase in the efficiency of the WDE mitigation performance. FIG. 15 shows an average normalized WDE and a capacity required for the main table. As shown in the drawing, the normalized WDE is 95% lower than the case without prior knowledge at 256 entries. Also, the capacity of the main table significantly increases from 512 entries. Accordingly, 256 entries may be selected as an appropriate number of entries in the main table in consideration of the trade-off between the performance and the area. In summary, the number of entries No in the main table is fixed at 256 below.

Figure 16A:
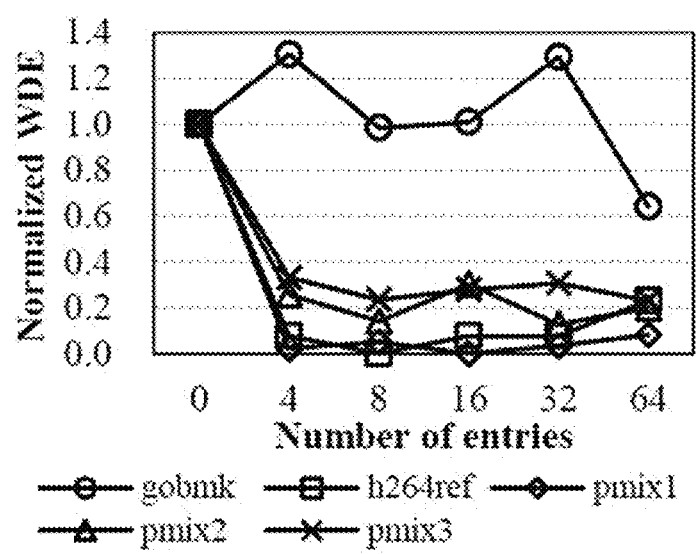
FIGS. 16A and 16B are a set of graphs illustrating performance with different numbers of entries in a barrier buffer normalized to a temporal base condition.
Figure 16B:
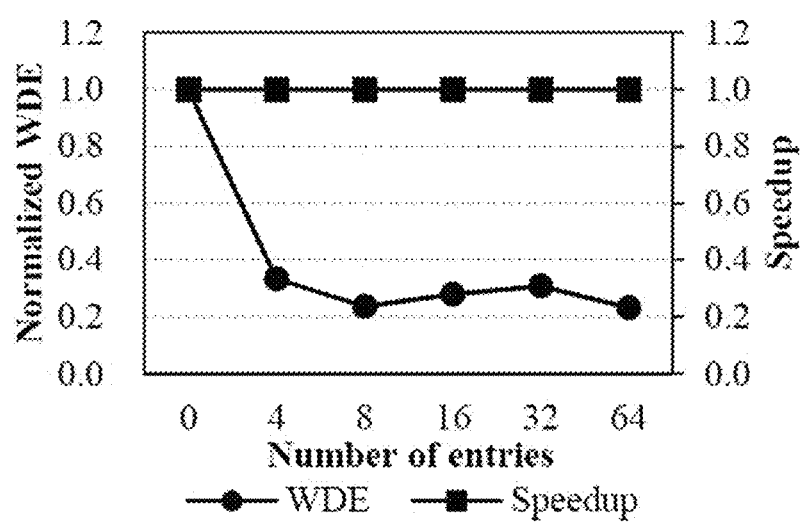

The barrier buffer, which is a small table containing data frequently flipped from 1 to 0, is expected to yield fewer WDEs. FIG. 16 shows the performance with difference numbers of entries in the barrier buffer. For clarity, the results of both drawings in FIG. 16 are normalized to a case in which the main table includes 256 entries and is supported by prior knowledge (called temporal base condition in this paragraph only). The figures show WDEs of benchmarks still containing errors under the temporal base condition, whereas other benchmarks maintain their free-WDE status. In FIG. 16A, most of the benchmarks yield significantly lower numbers of WDE with the barrier buffer from four entries. However, for gobmk, WDEs decrease when the barrier buffer containing 64 entries is applied. This occurs because some addresses have extremely long-period write-access patterns, which are hardly a concern of the proposed replacement policy regardless of whether the barrier buffer is applied. However, under the temporal base condition, WDEs are reduced by 90% relative to the baseline. Also, in the following description, the slightly randomized method, the AppLE, is shown to mitigate this problem. FIG. 16B shows the average normalized WDE and speedup values of the benchmarks mentioned above. The figures show that the speedup does not markedly increase for all ranges. Accordingly, $S^{-1}$ is referred to as a constant in Equation 2. Also, the capacity of the barrier buffer is at least three times as small as the main table for $N_b \leq 16$ and thus is negligible compared to the main table. Therefore, analyzing W in Equation 2 is sufficient to obtain a cost-effective architecture, and $N_b=8$ is selected as the trade-off point because the normalized WDE decreases stably from the point of 8 as shown in FIG. 16B.

Sensitivity analysis on the AppLE will be described below.

Figure 17A:
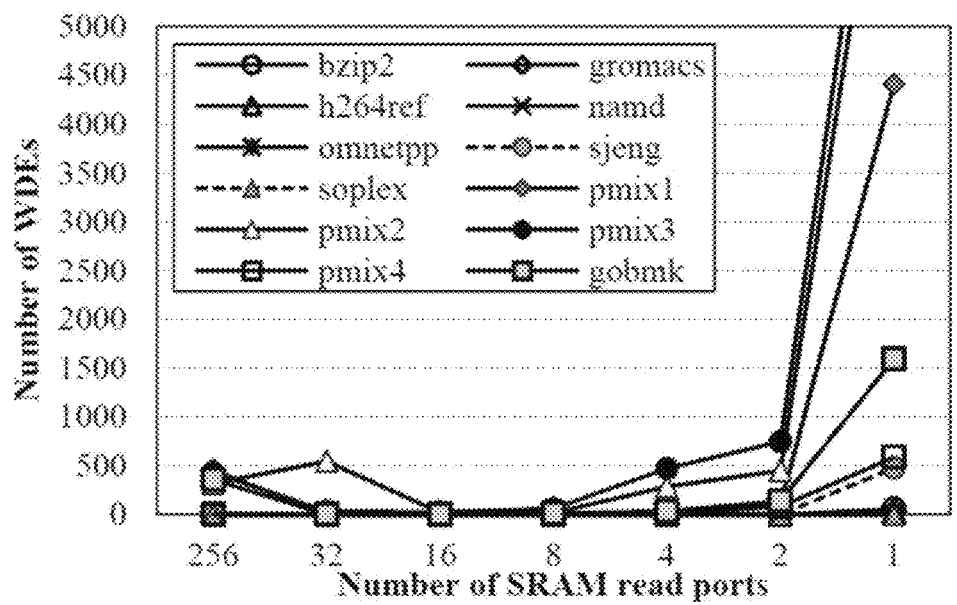
FIGS. 17A and 17B are a set of graphs illustrating normalized WDEs according to various numbers of read ports for an AppLE.
Figure 17B:
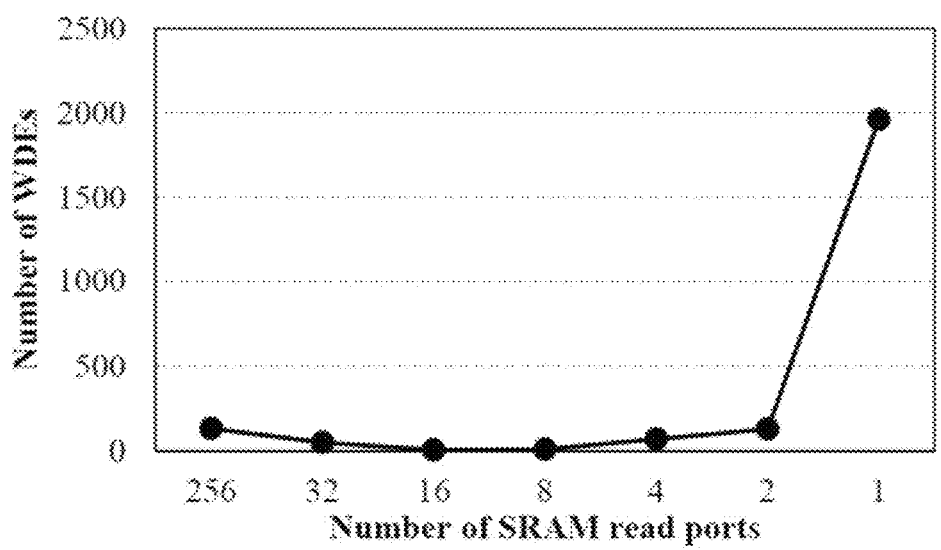
Figure 18A:
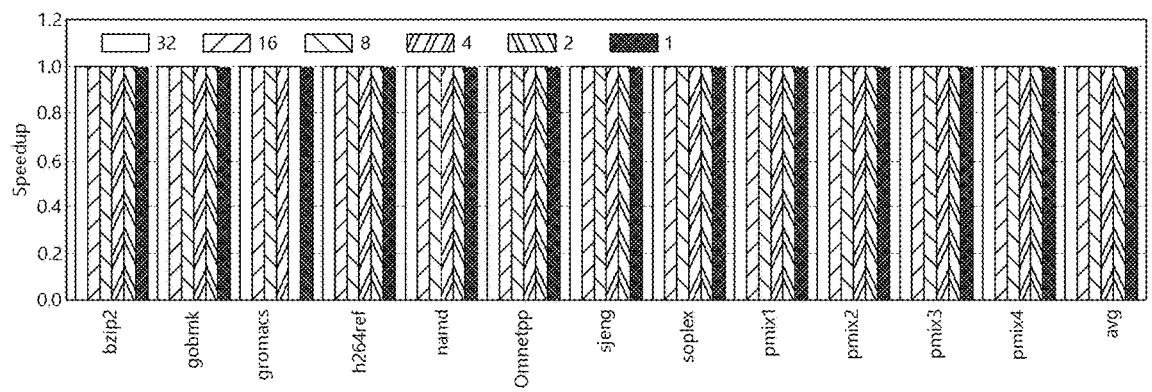
FIGS. 18A and 18B are a set of graphs illustrating speedup and energy consumption with respect to different numbers of read ports for an AppLE.
Figure 18B:
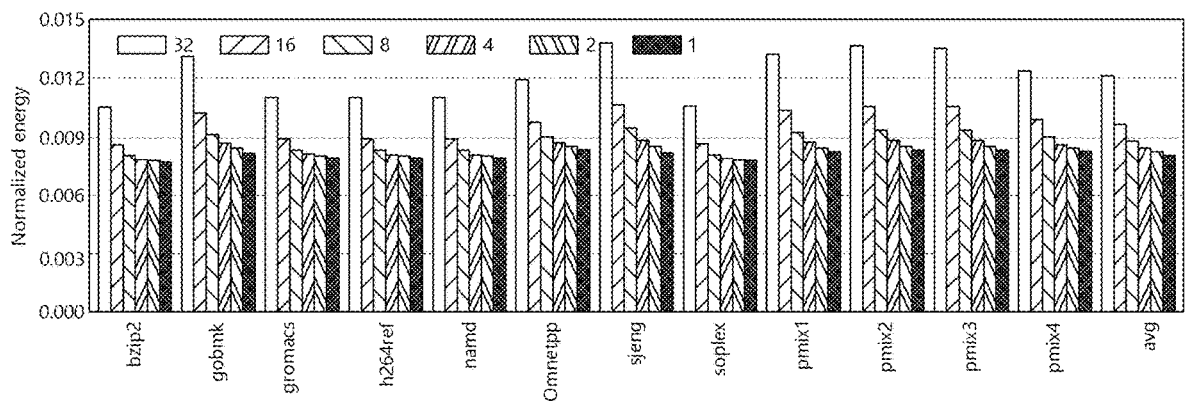

The AppLE is proposed to reduce the number of read ports on an SRAM for the replacement policy. Therefore, a sensitivity analysis with respect to the group size, which is regarded as the number of read ports on the SRAM, is required because the proposed method is a randomized approach. For a straightforward analysis, the barrier buffer is not applied in this evaluation. Also, the group size begins from 32 due to the feasibility of this value in a practical system. FIG. 17A shows the absolute number of WDEs with difference numbers of read ports. Here, 256 read ports means that the AppLE is not applied to the system. As shown in FIG. 17, the number of WDEs stabilizes with fewer read ports for most of the benchmarks. In particular, the gobmk benchmark, which involves long-period write-access patterns, shows fewer WDEs on fewer read ports because the gobmk benchmark prevents such "tricky addresses" from being evicted from the table by applying the randomized method. However, WDEs significantly increase from two read ports as shown in FIG. 17B. For the fully randomized replacement policy (i.e., one read port), the number of WDEs is 15 times higher than the case without the AppLE, and this indicates that the fully randomized replacement policy is less reliable than the proposed policy. FIG. 18 shows the energy consumption and speed performance with different numbers of read ports. As shown in FIG. 18A, the speed performance does not vary much according to the number of ports. Therefore, the latency time taken by multiple stages of sub-comparators has nearly no effect on the performance. Also, FIG. 18B shows that the energy consumption on the SRAM gradually decreases with a reduction in the number of read ports. The energy is decreased by 20%, 10%, and 6% when the number of read ports is decreased from 32 to 16, from 16 to 8, and from 8 to 4, respectively. For this perspective, $N_g=4$ or $N_g=8$ may be an appropriate design parameter for the AppLE herein.

As described above, the group size for the AppLE and the numbers of entries in the main table and the barrier buffer are suitably determined in consideration of the trade-off analyses. The method proposed in the present invention will be compared with the related arts.

The cost-effective architecture of the proposed method includes 256 entries in the main table and eight entries in the barrier buffer with a group size of eight, and the group size of four is denoted as IM4DB. (e256b8g4) is associated with a more aggressive reduction in the number of read ports on the SRAM.

Figure 19:
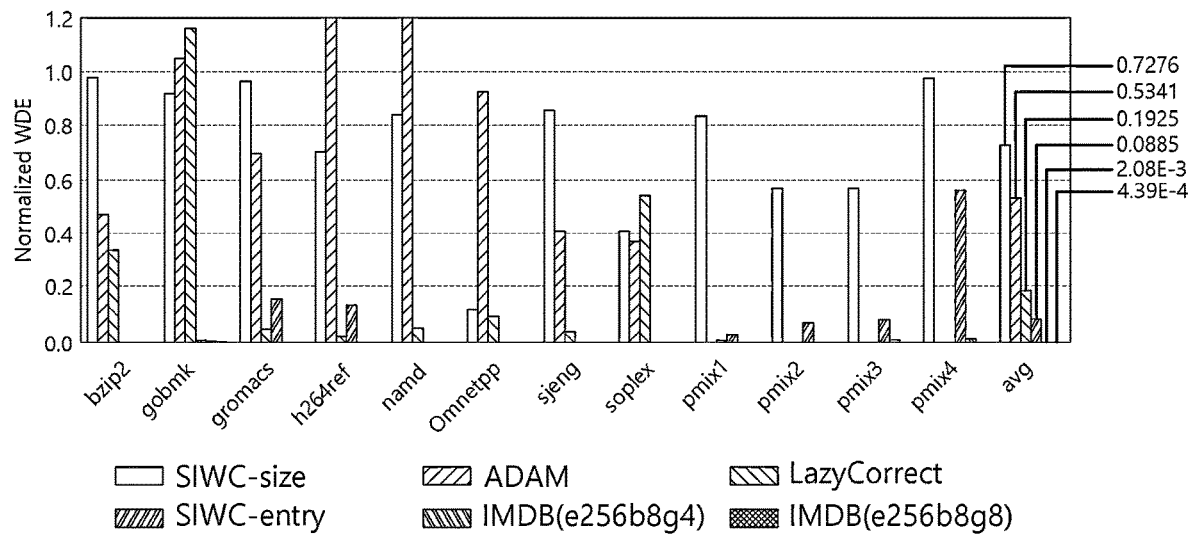
FIG. 19 is a graph illustrating normalized WDEs according to different schemes.

FIG. 19 shows a normalized WDE for each error mitigation method. SIWC-size shows the highest normalized WDE value, 0.7276, among all methods. This is because the SIWC is a cache-based approach which strongly depends on the number of entries. Accordingly, the worst WDE mitigation performance is shown when the SRAM capacity of the SIWC is identical to that of the proposed method. In contrast, the normalize WDE value is reduced to 0.085 (i.e., an 87.84% reduction compared to SIWC-size) when the SIWC manages the same number of entries used in the proposed method. However, the SIWC consumes 512b/108b=4.74 times more capacity on SRAM. For ADAM, the number of WDEs may be markedly reduced by compressing data to lower the number of vulnerable bits. Nonetheless, it is effective only when the compression ration exceeds 0.5. Accordingly, ADAM shows inferior performance, 0.5341, on average. Lazy correction is a VnC-based approach and thus removes errors effectively by sacrificing the speed. Lazy correction yields a normalized WDE value as low as 0.1925. On the other hand, IMDB (e256b8g4) shows that WDEs are significantly reduced to 2.08E-3. Specifically, there are 256 times, 93 times, and 43 times fewer WDEs compared to those caused by ADAM, lazy correction, and SIWC-entry, respectively. Also, the cost-effective architecture, i.e., IMDB (e256b8g8), shows 84.04% fewer WDEs than IMDB (e256b8g4). The cost-effective architecture yields 1218 times, 439 times, and 202 times better WDE mitigation performance than ADAM, lazy correction, and SIWC-entry, respectively.

Figure 20:
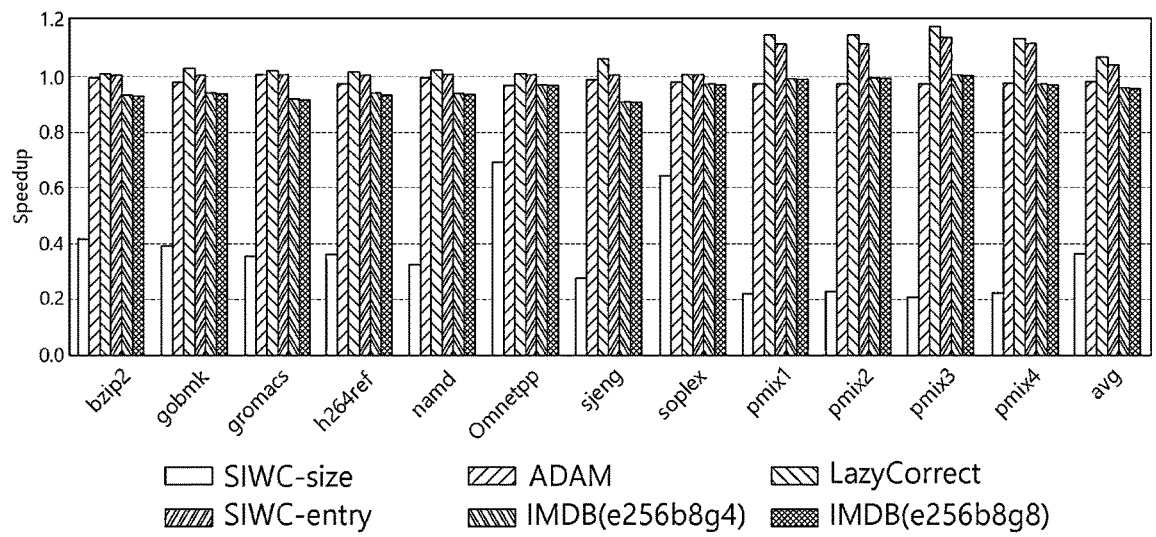
FIG. 20 is a graph illustrating speedup according to interference mitigation.

FIG. 20 shows the speedup of each method compared to the baseline. FIG. 20 shows that the speedup of lazy correction is 0.36 times, the lowest among all methods because each write incurs at least four read operations despite the fact that using the method according to the present invention reduces the number of corrections by utilizing a high-cost ECP device. Although the proposed method is required to rewrite two instances of adjacent data, the rewrite operation is performed in an on-demand fashion instead of incurring four read operations per write operation, as VnC does. Therefore, the proposed method outperforms lazy correction. In contrast, the speedup of ADAM is degraded by 2% compared to the baseline method due to the overhead of FPC. For SIWC-entry and SIWC-size, the write cache may directly provide data to the processor. Accordingly, SIWC-entry and SIWC-size provide the highest speedup of 1.06 times and 1.04 times, respectively. The object of the present invention is to provide a highly stable system with negligible performance loss as compared to the baseline which does not adopt any error mitigation method. In this regard, the proposed method yields approximately 4% speed degradation on average, which is slightly lower than the baseline due to prewrite read operations. Also, there is a performance difference of only 0.3% between IMDB (e256b8g4) and IMDB (e256b8g8), which means that the number of stages on the sub-comparators of the AppLE does not influence the speed performance significantly. Meanwhile, there are far fewer WDEs compared to those in existing methods. Although SIWC-entry shows a slightly higher speedup, the WDE mitigation performance is much worse than that by the proposed method, and thus SIWC-entry leads to a system with low stability as described above. As a result, these results imply that the proposed method is suited for a highly reliable system for supporting high performance computing.

Figure 21:
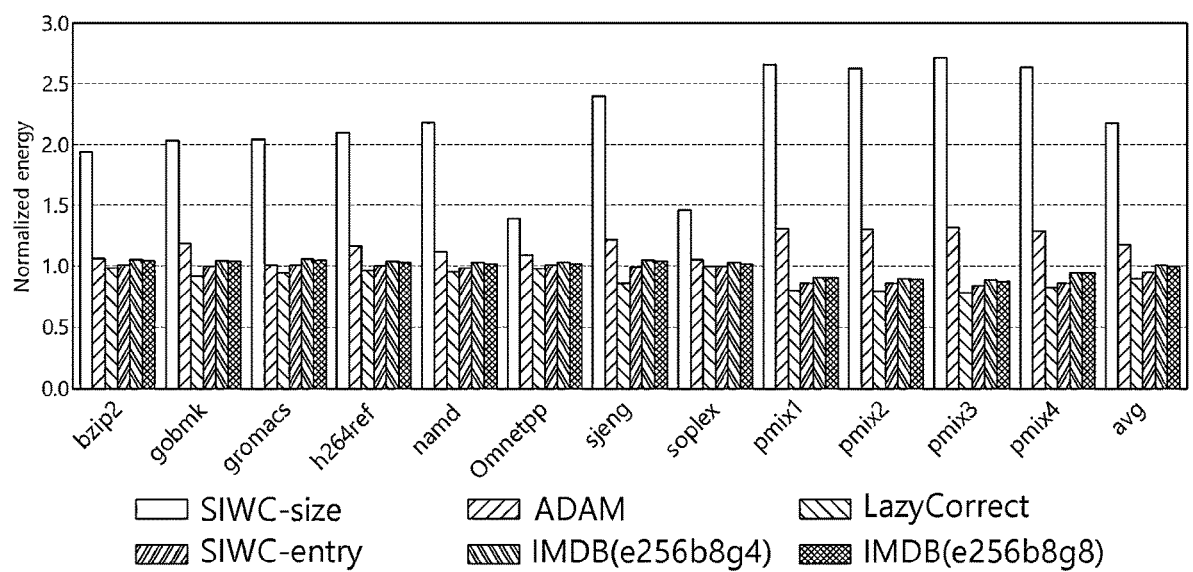
FIG. 21 is a graph showing normalized energy consumption with regard to various WDE mitigation methods.

FIG. 21 shows the normalized energy in the system (i.e., PCM+SRAM). Lazy correction consumes 2.18 times more energy in comparison with the baseline due to redundant operations incurred by VnC. This is 45.87% more energy consumption than ADAM, which is 1.18 times higher than the baseline. Despite the fact that lazy correction perfectly eliminates WDEs, lazy correction is much slower and uses more operations than the methods without VnC and thus consumes much more energy than the other methods. Meanwhile, the write cache of SIWC-size absorbs write operations on frequently accessed addresses. This is because persistent workloads have relatively high locality rates caused by cache line flush commands. As a result, the write energy consumption is reduced. Therefore, SIWC-size consumes 5% less energy compared to the baseline. Furthermore, the energy may be lowered to 10.5% with a larger number of entries as declared by SIWC-entry. However, the WDE mitigation performance is not excellent as shown in FIG. 19. The proposed method consumes more energy than SIWC. Although IMDB (e256b8g8) shows 9% higher energy consumption compared to SIWC-entry, this outcome is still 0.59% lower than the baseline due to on-demand rewrite operations and the "tiny" barrier buffer (i.e., normalized energy is 0.9941). In addition, compared with lazy correction which is a VnC-based approach, the proposed method nearly eliminates all errors while consuming 54.4% less energy. These outcomes show that the proposed method requires only a tiny area without sacrificing either speed or energy efficiency.

The present invention proposes an on-demand table-based method for reducing WDEs within a PCM module. The proposed method utilizes SRAM tables to manage variations of write data, by which highly vulnerable addresses are rewritten. The present invention declares that the table-based method requires a dedicated replacement policy, and prior knowledge of zeros in write data can enhance the WDE mitigation performance. Subsequently, the AppLE efficiently reduces the number of read ports on SRAMs required for the proposed policy to reduce both the area and energy overhead incurred by the overloaded multi-port SRAMs. The present invention also shows that the LRU policy and the fully randomized replacement policy are less reliable than the proposed method. On the other hand, a small amount of the SRAM absorbs additional bit flips and allows offloading of supercapacitor burden required for system failures. Consequently, some rigorous sensitivity analyses concerning design parameters are performed to obtain a cost-effective architecture. According to the analysis, the proposed work can reduce WDEs by 1218 times, 439 times, and 202 times compared to ADAM, lazy correction, and SIWC-entry, respectively, while maintaining the operation speed and energy consumption which are almost similar to those of the baseline.

According to the present invention, it is possible to markedly reduce WDEs without appreciable slowdown and additional energy consumption compared to the related art.

Also, according to the PCM module proposed by the present invention, it is possible to easily evict insufficiently baked addresses which can incur WDEs in other cells.

The experimental results indicate that the proposed method reduces WDEs by 1,218 times, 439 times, and 202 times respectively in comparison with ADAM, lazy correction, and SIWC-entry with negligible speed degradation.

In particular, according to the present invention, it is possible to implement a low-cost on-demand rewrite method supported by a two-tier SRAM in order to reduce WDEs. This is the first attempt of on-demand approach based on a more practical WDE trigger model to reduce WDEs.

What is claimed is:

1. A phase-change memory module comprising:
a phase-change memory device including a bit line and a word line;
a memory controller configured to output a command related to an operation of the phase-change memory device; and
an interference mitigation part located between the memory controller and the phase-change memory device and configured to perform a rewrite operation on the basis of a state transition characteristic of the command output from the memory controller.

2. The phase-change memory module of claim 1, wherein the interference mitigation part calculates a number of 1-to-0 flips of the command and performs a rewrite operation for the command when the calculated number of 1-to-0 flips exceeds a preset threshold value.

3. The phase-change memory module of claim 2, wherein the interference mitigation part includes:
a main table that stores an accumulated number of rewrite operations and an accumulated number of calculated flips;
a buffer table that stores data related to a command to be rewritten; and
an approximate lowest number estimator that samples one group from a plurality of table entries to minimize a cycle consumed by a replacement policy of the main table and the buffer table.

4. The phase-change memory module of claim 3, wherein a data structure of each entry included in the main table includes at least one of:
an address variable (Row & Col) in which an address corresponding to the command is stored;
a rewrite control variable (RewriteCntr) which is increased by a preset value every time a rewrite operation is performed by the interference mitigation part;
a zero flip control variable (ZeroFlipCntr) in which the accumulated number of 1-to-0 flips is recorded; and
a max zero flip control variable (MaxZFCidx) in which an index corresponding to a largest one of zero flip control variables is recorded.

5. The phase-change memory module of claim 4, wherein, when the zero flip control variable of one entry included in the main table exceeds the threshold value, the interference mitigation part performs a rewrite operation for the entry.

6. The phase-change memory module of claim 4, wherein, when a rewrite operation is performed for the command, the interference mitigation part records data corresponding to the command in the main table to the buffer table, and
a data structure of entries included in the buffer table includes at least one of:
an address variable in which the address variable in the main table is transferred and stored;
a rewrite control variable in which the rewrite control variable in the main table is transferred and stored;
a command variable which stores the command; and
a frequency control variable (FreqCntr).

7. The phase-change memory module of claim 3, wherein the approximate lowest number estimator defines a certain number of main table entries as one group and performs a replacement policy for the main table by applying the defined group as one unit cycle.

8. The phase-change memory module of claim 7, wherein the approximate lowest number estimator sets a random offset for each defined group and performs a read operation on the entries included in the defined group on the basis of the set offset.

9. The phase-change memory module of claim 3, wherein the main table and the buffer table include two sets of static random access memories (SRAMs).

10. The phase-change memory module of claim 8, wherein the main table includes a first SRAM and a second SRAM,
wherein the first SRAM indexes the entry of the main table and is allocated to an address variable of the main table, and
the second SRAM is allocated to a zero flip control variable, a max zero flip control variable, and a rewrite control variable of the main table.

* * * * *